(12) United States Patent
Seo et al.

(10) Patent No.: US 11,487,182 B2
(45) Date of Patent: Nov. 1, 2022

(54) DISPLAY DEVICE AND METHOD OF MANUFACTURING LENTICULAR LENS PANEL

(71) Applicant: Samsung Display Co., Ltd., Yongin-Si (KR)

(72) Inventors: Jiyeon Seo, Hwaseong-si (KR); SuJung Huh, Yongin-si (KR); Dong-Chul Shin, Hwaseong-si (KR); Jiwon Lee, Hwaseong-si (KR); Youngsang Ha, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/083,974

(22) Filed: Oct. 29, 2020

(65) Prior Publication Data

US 2021/0149270 A1  May 20, 2021

(30) Foreign Application Priority Data

Nov. 14, 2019  (KR) .......................... 10-2019-0145869

(51) Int. Cl.
*G02F 1/29* (2006.01)
*G02F 1/1335* (2006.01)
*H01L 51/52* (2006.01)

(52) U.S. Cl.
CPC .......... *G02F 1/29* (2013.01); *G02F 1/133526* (2013.01); *H01L 51/5275* (2013.01)

(58) Field of Classification Search
None
See application file for complete search history.

(56) References Cited

U.S. PATENT DOCUMENTS

| 2007/0019132 A1* | 1/2007 | Kim ................... G02F 1/133526 349/95 |
| 2008/0013002 A1* | 1/2008 | Hong ................ G02F 1/133711 349/200 |
| 2014/0016070 A1 | 1/2014 | Choi et al. |
| 2014/0043574 A1* | 2/2014 | Ichimura ............... G02F 1/1339 349/138 |

(Continued)

FOREIGN PATENT DOCUMENTS

| KR | 1020060078405 A | 7/2006 |
| KR | 101324398 B1 | 11/2013 |

(Continued)

*Primary Examiner* — Ryan Crockett
(74) *Attorney, Agent, or Firm* — Cantor Colburn LLP

(57) ABSTRACT

A display device includes a display panel which displays an image and a lenticular lens panel disposed above the display panel, where a lenticular lens area and a sealing area adjacent to the lenticular lens area are defined in the lenticular lens panel. The lenticular lens panel includes a first substrate disposed on the display panel, a second substrate disposed opposite to the first substrate, an insulating layer disposed between the first substrate and the second substrate, where a plurality of lenticular lens surfaces overlapping the lenticular lens area and a groove overlapping the sealing area are defined on the insulating layer, a sealing member disposed in the groove, where the sealing member combines the first substrate with the insulating layer, and a plurality of liquid crystal molecules disposed between the lenticular lens surfaces and the first substrate.

18 Claims, 12 Drawing Sheets

(56) References Cited

U.S. PATENT DOCUMENTS

| | | | | |
|---|---|---|---|---|
| 2014/0320774 | A1* | 10/2014 | Chen | G02B 30/28 |
| | | | | 359/463 |
| 2015/0160467 | A1* | 6/2015 | Kim | G02B 30/25 |
| | | | | 349/15 |
| 2016/0104757 | A1* | 4/2016 | Kim | H01L 27/1222 |
| | | | | 438/34 |
| 2017/0010500 | A1* | 1/2017 | Han | G02F 1/1345 |
| 2017/0025082 | A1* | 1/2017 | Kobayashi | G02F 1/1339 |
| 2018/0210219 | A1* | 7/2018 | Lin | G02F 1/31 |

FOREIGN PATENT DOCUMENTS

| | | |
|---|---|---|
| KR | 1020140010634 A | 1/2014 |
| KR | 1020180029065 A | 3/2018 |

* cited by examiner

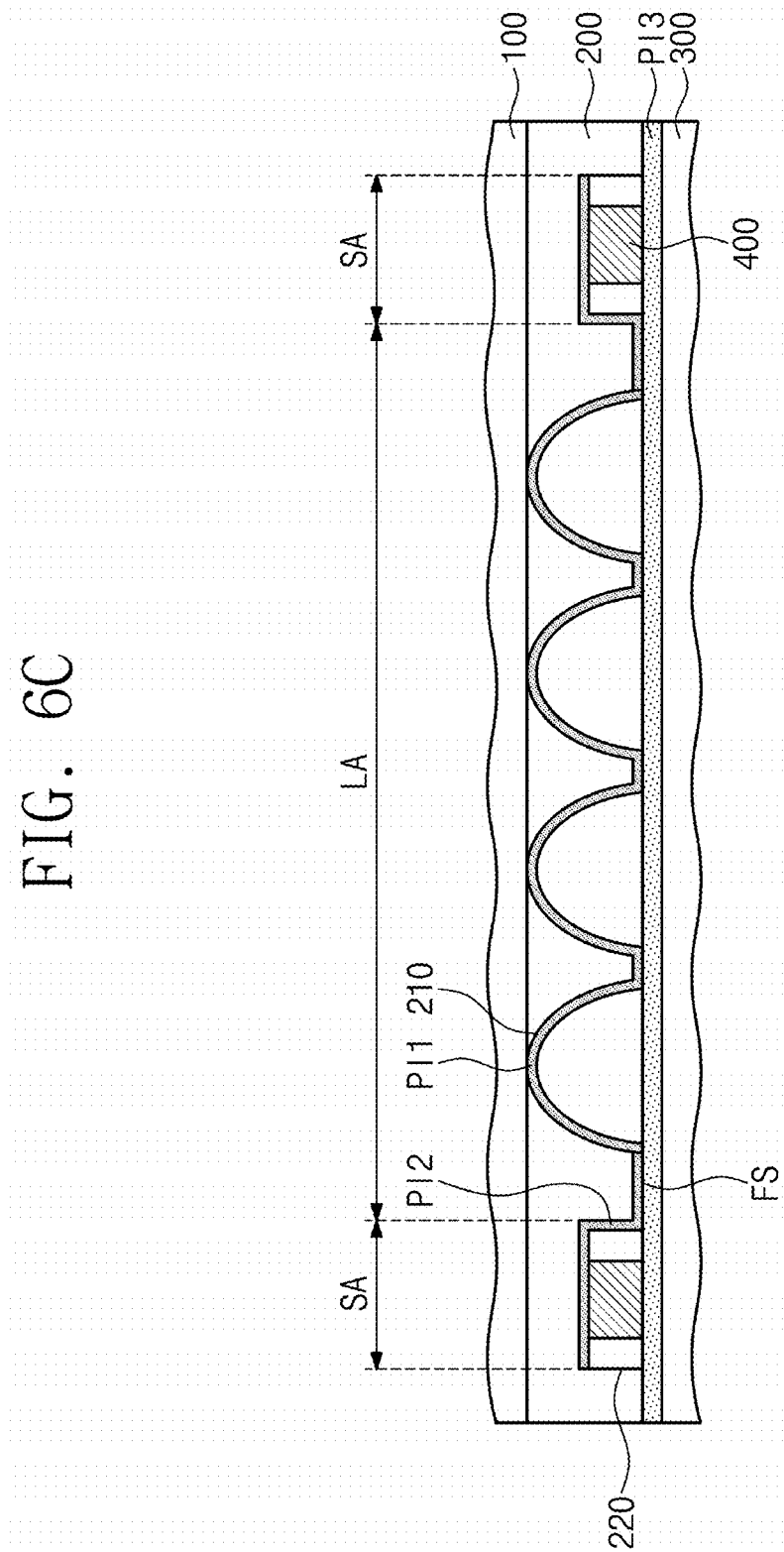

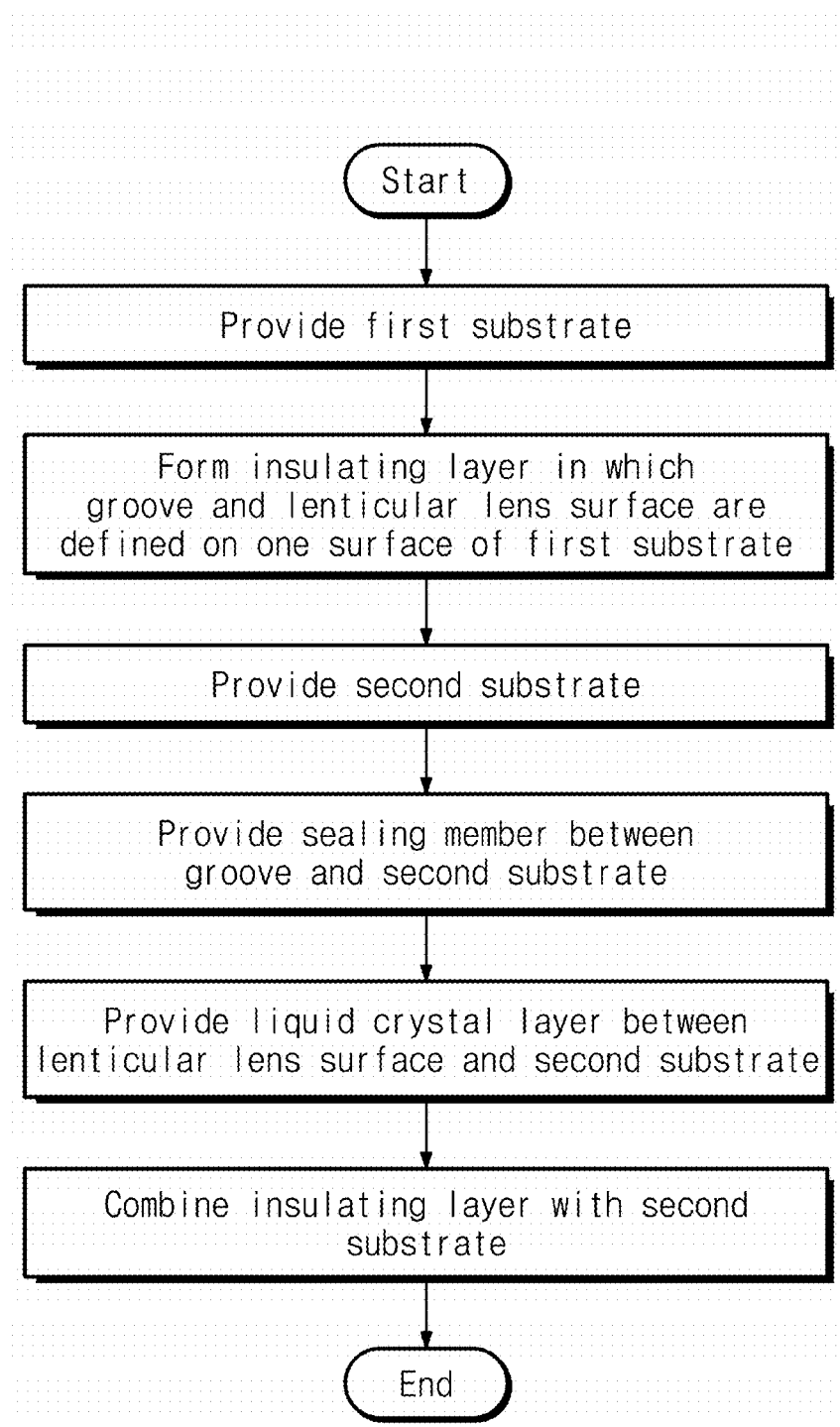

DISPLAY DEVICE AND METHOD OF MANUFACTURING LENTICULAR LENS PANEL

This application claims priority to Korean Patent Application No. 10-2019-0145869, filed on Nov. 14, 2019, and all the benefits accruing therefrom under 35 U.S.C. § 119, the content of which in its entirety is herein incorporated by reference.

BACKGROUND

1. Field

The disclosure relates to a display device and a method of manufacturing a lenticular lens panel. More particularly, the disclosure relates to a display device with improved three-dimensional image quality and a method of manufacturing a lenticular lens panel.

2. Description of the Related Art

A stereoscopic image display device displays a left-eye image and a right-eye image having binocular disparity separately and respectively to a left eye and a right eye of an observer. The observer sees the left-eye image and the right-eye image through both the left and right eyes, respectively, and then perceives the images in three-dimension by combining the left-eye image and the right-eye image.

The binocular disparity method uses parallax images of the left and right-eyes with effective three-dimensional ("3D") effect. The binocular disparity methods are classified into a glasses type and a non-glasses type. Both the glasses type and the non-glasses type are used in many practical applications. According to the non-glasses type, a lenticular lens or a parallax barrier is disposed to be spaced apart from a two-dimensional ("2D") image display panel by a predetermined distance, so that image information different from each other are recognized by the left eye and the right eye of the observer, respectively.

Particularly, in the stereoscopic image display device employing the lenticular lens, the lenticular lens has a semi-cylindrical shape, and left and right images, which have a striped shape, are disposed on a focal surface of the lenticular lens. The left and right images are separated from each other due to the lenticular lens, so that the observer sees the stereoscopic image without the glasses.

SUMMARY

Embodiments of the disclosure relate to a display device in which a space in a liquid crystal layer between an upper plate and a lenticular lens layer is reduced by reducing a space occupied by a sealant connecting the upper plate and the lenticular lens layer.

Embodiments of the disclosure relate to a display device including a lenticular lens panel provided with the lenticular lens layer having a groove into which the sealant is inserted.

Embodiments of the disclosure relate to a display device with improved three-dimensional ("3D") image quality by preventing formation of an undesired space of the liquid crystal layer.

An embodiment of the invention provide a display device including a display panel which displays an image and a lenticular lens panel disposed above the display panel, where a lenticular lens area and a sealing area adjacent to the lenticular lens area are defined in the lenticular lens. In such an embodiment, the lenticular lens panel includes a first substrate disposed on the display panel, a second substrate disposed opposite to the first substrate, an insulating layer disposed between the first substrate and the second substrate, where a plurality of lenticular lens surfaces overlapping the lenticular lens area and a groove overlapping the sealing area are defined on the insulating layer, a sealing member disposed in the groove, where the sealing member combines the first substrate with the insulating layer, and a plurality of liquid crystal molecules disposed between the lenticular lens surfaces and the first substrate.

In an embodiment, the display device further includes a switching panel disposed between the display panel and the lenticular lens panel, where the switching panel may control the image to be selectively displayed as a two-dimensional image or a three-dimensional image.

In an embodiment, the insulating layer may include a flat surface defined between an end of the groove and an end of a lenticular lens surface closest to the groove among the lenticular lens surfaces, and the flat surface may be in contact with the first substrate.

In an embodiment, the groove may be defined by an upper surface in contact with the sealing member and a side surface perpendicular to the upper surface, and a length of the side surface is equal to a vertical length of the sealing member.

In an embodiment, the sealing member has a vertical length greater than a depth of the groove.

In an embodiment, each of the lenticular lens surfaces may be a concave lens surface.

In an embodiment, the lenticular lens panel may further include a first alignment layer disposed on the lenticular lens surfaces and a second alignment layer disposed on a flat surface defined between the groove and an end of the lenticular lens surface closest to the groove among the lenticular lens surfaces.

In an embodiment, a distance between the groove and the end of the lenticular lens surface closest to the groove may be in a range from about 2 millimeters (mm) to about 5 mm.

In an embodiment, the second alignment layer may extend to a side surface and an upper surface of the groove adjacent to the flat surface.

In an embodiment, a maximum distance from the lenticular lens surfaces to the first substrate may be equal to a maximum distance from the lenticular lens surfaces to a flat surface defined between one end of the lenticular lens surfaces and one end of the groove.

In an embodiment, a distance between an upper surface of the groove and the first substrate may be smaller than a height of the insulating layer.

In an embodiment, the maximum distance between the lenticular lens surfaces and the flat surface may be equal to or smaller than a distance between an upper surface of the groove and the flat surface.

In an embodiment, the groove may have a depth in a range from about 3 micrometers (μm) to about 5 μm.

In an embodiment, a maximum distance from the lenticular lens surfaces to the flat surface defined between an end of the lenticular lens surfaces and an end of the groove may be equal to or smaller than about 5 μm, the maximum distance from the lenticular lens surfaces to the flat surface may be smaller than the depth of the groove, and the lenticular lens surfaces may be spaced apart from the second substrate.

In an embodiment, a maximum distance from the lenticular lens surfaces to the flat surface defined between an end of the lenticular lens surfaces and an end of the groove may be equal to or greater than about 5 μm, and the maximum distance between the lenticular lens surfaces and the flat surface may be equal to a height of the insulating layer.

In an embodiment, the lenticular lens panel may further include a first conductive layer disposed on the first alignment layer and the second alignment layer, and the first conductive layer may extend to the groove.

In an embodiment, the lenticular lens panel may further include a third alignment layer disposed on an upper surface of the first substrate facing the insulating layer.

In an embodiment, the lenticular lens panel may further include a second conductive layer disposed above the third alignment layer.

An embodiment of the invention provide a method of manufacturing a lenticular lens panel including providing a first substrate, forming an insulating layer in which a groove and a lenticular lens surface are defined on a surface of the first substrate, providing a second substrate, providing a sealing member between the insulating layer and the second substrate to correspond to the groove, providing a liquid crystal layer between the lenticular lens surface and the second substrate, and combining the insulating layer with the second substrate.

In an embodiment, the forming the insulating layer may include coating an ultraviolet-curable resin on the first substrate in a film shape, pressing a mold having a shape corresponding to the groove and the lenticular lens surface onto the ultraviolet-curable resin, and irradiating an ultraviolet light to the ultraviolet-curable resin onto which the mold is pressed.

According to embodiments, the groove is formed in the lenticular lens layer and the sealant is disposed in the groove, such that a thickness of the liquid crystal layer between the upper plate and the lenticular lens layer may be prevented from increasing by the thickness of the sealant. Therefore, the thickness of the lenticular lens panel of the display device may be reduced, and the liquid crystal molecules in the liquid crystal layer may be prevented from being changed by an external force, thereby improving the 3D image quality.

BRIEF DESCRIPTION OF THE DRAWINGS

The above and other features of the disclosure will become readily apparent by reference to the following detailed description when considered in conjunction with the accompanying drawings, in which:

FIGS. 6A to 6D are cross-sectional views showing a lenticular lens panel according to an embodiment of the disclosure; and FIGS. 7A and 7B are views showing a method of manufacturing a lenticular lens panel according to an embodiment of the disclosure.

DETAILED DESCRIPTION

Figure 1:
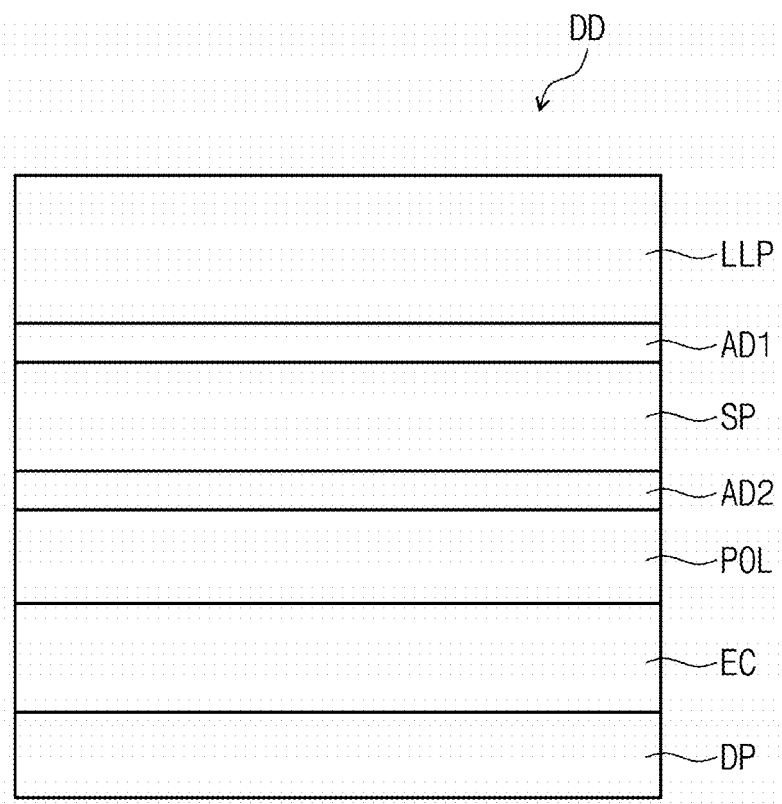
FIG. 1 is a cross-sectional view showing a display device according to an embodiment of the disclosure.
Figure 1:
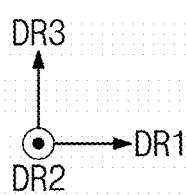

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "connected directly to", or "coupled directly to" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a cross-sectional view showing a display device DD according to an embodiment of the disclosure.

Referring to FIG. 1, an embodiment of the display device DD includes a display panel DP and a lenticular lens panel LLP. In such an embodiment, the display device DD includes the lenticular lens panel LLP in which a lenticular lens area and a sealing area adjacent to the lenticular lens area are defined on the display panel DP. The display device DD includes an encapsulation layer EC and a polarizing plate POL, which are disposed between the display panel DP and the lenticular lens panel LLP.

The display panel DP displays an image. The display panel DP may be a light emitting type display panel, but not being limited thereto. In one embodiment, for example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. In one embodiment, for example, where the display panel DP is a liquid crystal display panel, the display panel DP may further include a backlight unit (not shown) disposed at a rear side of the display panel DP for providing a light to the display panel DP. An amount of the light provided to the display panel from the backlight unit and passing through the display panel DP may be controlled based on an arrangement direction of liquid crystals of the liquid crystal layer (not shown) of the display panel DP and may be provided to color filters (not shown).

The light exiting from the display panel DP passes through the lenticular lens panel LLP disposed on a front surface (or a display surface) of the display panel DP. In an embodiment, the front surface of the display panel DP may be on a plane defined by a first direction DR1 and a second direction DR3 crossing each other. Here, a third direction DR3 may be a direction perpendicular to the first and second directions DR1 and DR2 or a thickness direction of the display panel DP. The lenticular lens panel LLP includes a first substrate 300 (refer to FIG. 2) of a transparent material, a second substrate 100 (refer to FIG. 2) of a transparent material, and an insulating layer 200 (refer to FIG. 2) including a lenticular lens surface 210 (refer to FIG. 2). The lenticular lens panel LLP allocates three primary colors corresponding to a data signal for left-eye and a data signal for right-eye from sub-pixels of the display panel DP to left and right eyes of a user. That is, the lenticular lens panel LLP is attached to the front surface of the display panel DP, converts an image provided from the display panel DP to a three-dimensional ("3D") image, and provides the 3D image to the user. Embodiments of the lenticular lens panel LLP will be described later in greater detail with reference to FIG. 2.

The encapsulation layer EC is disposed on the display panel DP and protects a display element layer (not shown) of the display panel DP from moisture and oxygen or foreign substance. The polarizing plate POL is disposed under the lenticular lens panel LLP and attached to the lenticular lens panel LLP by an optically transparent adhesive member.

The display device DD further includes a switching panel SP that controls the display device DD to selectively display the image as a two-dimensional ("2D") image or a 3D image. The switching panel SP is disposed between the display panel DP and the lenticular lens panel LLP. The switching panel SP is disposed above the display panel DP to be spaced apart from the display panel DP by a predetermined distance and allows the display device DD to selectively display the 2D image and the 3D image in response to a switching signal. The switching panel may have a structure that transmits all the light from the display panel DP when the 2D image is displayed and that corresponds to pixel information of the display panel DP when the 3D image is displayed. In one embodiment, for example, the switching panel SP includes a valid image display area that transmits the light when the 3D image is displayed and a selective block area that surrounds the valid image display area. In such an embodiment, the selective block area controls whether to block the light in response to the switching signal. The switching panel SP includes a liquid crystal panel that selectively turns on/off the light in response to the switching signal. In one embodiment, for example, the switching panel SP may be a super twisted nematic ("STN") liquid crystal panel or a twisted nematic ("TN") liquid crystal panel. The switching panel SP is disposed between the lenticular lens panel LLP and the display panel DP and attached to the lenticular lens panel LLP and the display panel DP by optically transparent adhesive members AD1 and AD2, respectively. In an embodiment, the optically transparent adhesive members AD1 and AD2 are an optically clear adhesive ("OCA") or an optically clear resin ("OCR").

Figure 2:
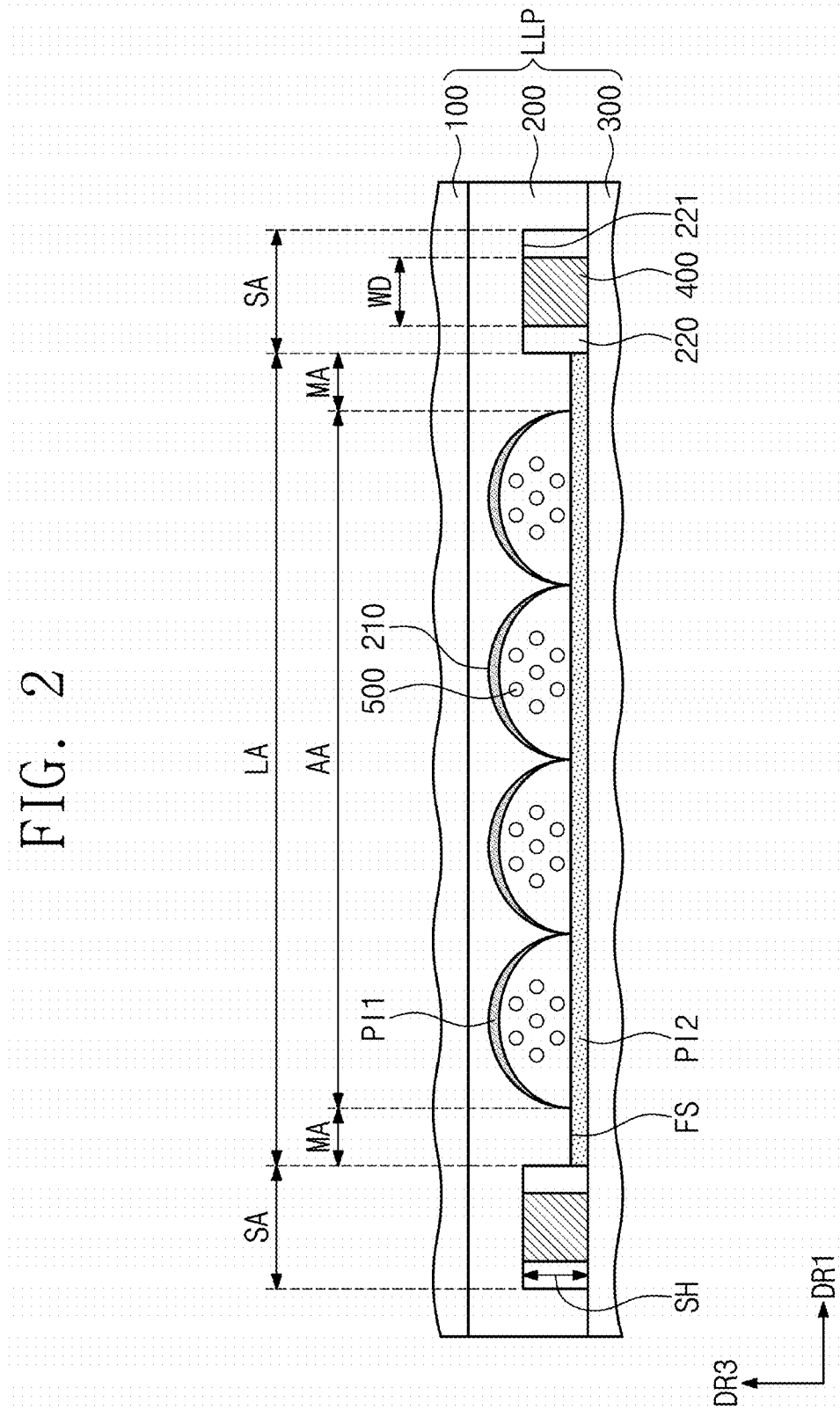
FIG. 2 is a cross-sectional view showing a lenticular lens panel according to an embodiment of the disclosure.

FIG. 2 is a cross-sectional view showing the lenticular lens panel LLP according to an embodiment of the disclosure.

Referring to FIG. 2, an embodiment of the lenticular lens panel LLP includes the first substrate 300, the second substrate 100, the insulating layer 200, a sealing member 400, and liquid crystal molecules 500.

The first substrate 300 is disposed on the display panel DP. The second substrate 100 is disposed on the first substrate 300, and the insulating layer 200 is disposed between the first substrate 300 and the second substrate 100. The first substrate 300 and the second substrate 100 include a transparent material, such as glass, polyethylene terephthalate ("PET"), or polycarbonate ("PC"). The insulating layer 200 includes an ultraviolet-curable resin. In one embodiment, for example, the insulating layer 200 includes an acyl-based ultraviolet-curable resin. A plurality of lenticular lens surfaces 210 overlapping the lenticular lens area LA and a groove 220 overlapping the sealing area SA are defined in the insulating layer 200. Each lenticular lens surface 210 may be a concave lens surface, but not being limited thereto or thereby.

Air gaps are defined between the lenticular lens surfaces 210 and the first substrate 300, and the liquid crystal molecules 500 are disposed in the air gaps. That is, the liquid crystal molecules 500 are filled between the lenticular lens surfaces 210 and the first substrate 300 to form a switchable liquid crystal lenticular lens. According to an embodiment, a first alignment layer PI1 is disposed on each of the lenticular lens surfaces 210.

The sealing member 400 is disposed in the groove 220 to combine the first substrate 300 with the insulating layer 200. In one embodiment, for example, the sealing member 400 includes a rubber material, and connects and fixes an inner upper surface 221 of the groove 220 to a surface (e.g., an upper surface) of the first substrate 300.

In an embodiment, a flat surface FS is defined between the groove 220 and an end of the lenticular lens surface 210 closest to the groove 220 among the lenticular lens surfaces 210 in the insulating layer 200. The lenticular lens surfaces 210 overlap an active area AA, and the flat surface FS overlaps a margin area MA adjacent to the active area AA. The flat surface FS is in contact with the surface of the first substrate 300. In an embodiment, the flat surface FS includes a second alignment layer PI2, and the first substrate 300 is in contact with the second alignment layer PI2. The first alignment layer PI1 and the second alignment layer PI2 include polyimide and align the liquid crystal molecules 500 in a same direction as each other. In the embodiment, the flat surface FS has a length in a range from about 2 millimeters (mm) to about 5 mm, e.g., about 2.4 mm. In one embodiment, for example, a length between the end of the lenticular lens surface 210 closest to the groove 220 among the lenticular lens surfaces 210 and the sealing member 400 is about 2.9 mm. A width WD of a contact surface of an upper surface 221 of the groove 220, which is in contact with the sealing member 400, is about 2 mm. A length of the upper surface 221 of the groove 220 is in a range from about 3.5 mm to about 4 mm.

In an embodiment, a plurality of spacing surfaces is defined between the lenticular lens surfaces 210, respectively, and the spacing surfaces make contact with the first substrate 300.

The groove 220 includes the upper surface in contact with the sealing member 400 and opposing side surfaces substantially perpendicular to the upper surface, and a length of the opposing side surfaces is the same as a vertical length (or height) of the sealing member 400 or is smaller than the vertical length (or height) of the sealing member 400. The sealing member 400 is disposed not on the flat surface FS of the insulating layer 200 but on the groove 220 and connects the insulating layer 200 to the first substrate 300. Accordingly, undesired spaces in the liquid crystal layer (air gaps) may be prevented from being formed by the lenticular lens surfaces 210 defined in the insulating layer 200. In such an embodiment of the disclosure, a maximum length between the first substrate 300 and the lenticular lens surface is the same as a maximum distance between the lenticular lens surface and the flat surface FS. Therefore, an extra space (or layer) is not formed in the space of the liquid crystal layer, which is filled with the liquid crystal molecules 500, and change in the liquid crystal molecules by an external force is not caused. Thus, the display device DD provides the 3D image having improved quality.

Figure 3:
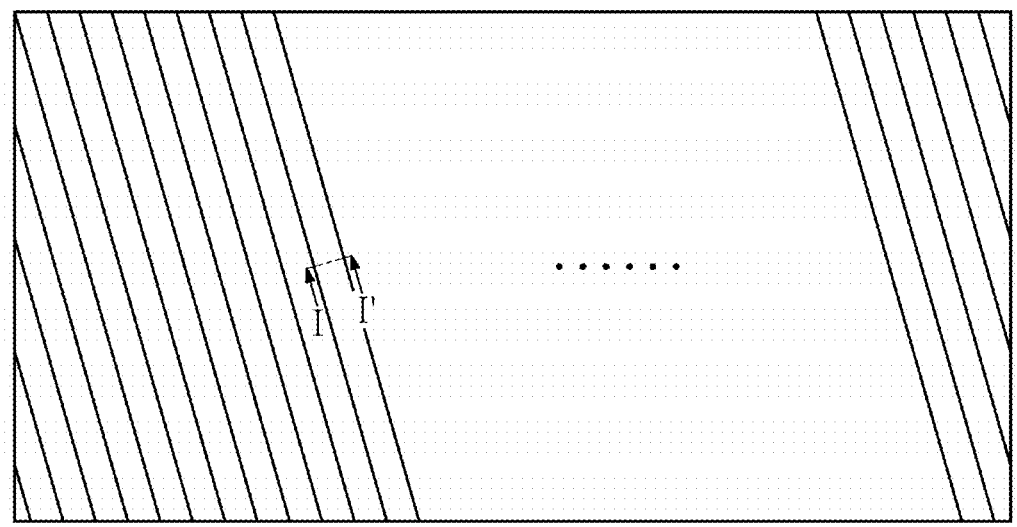
FIG. 3 is a plan view showing a lenticular lens panel according to an embodiment of the disclosure.
Figure 3:
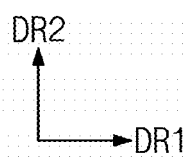
Figure 4:
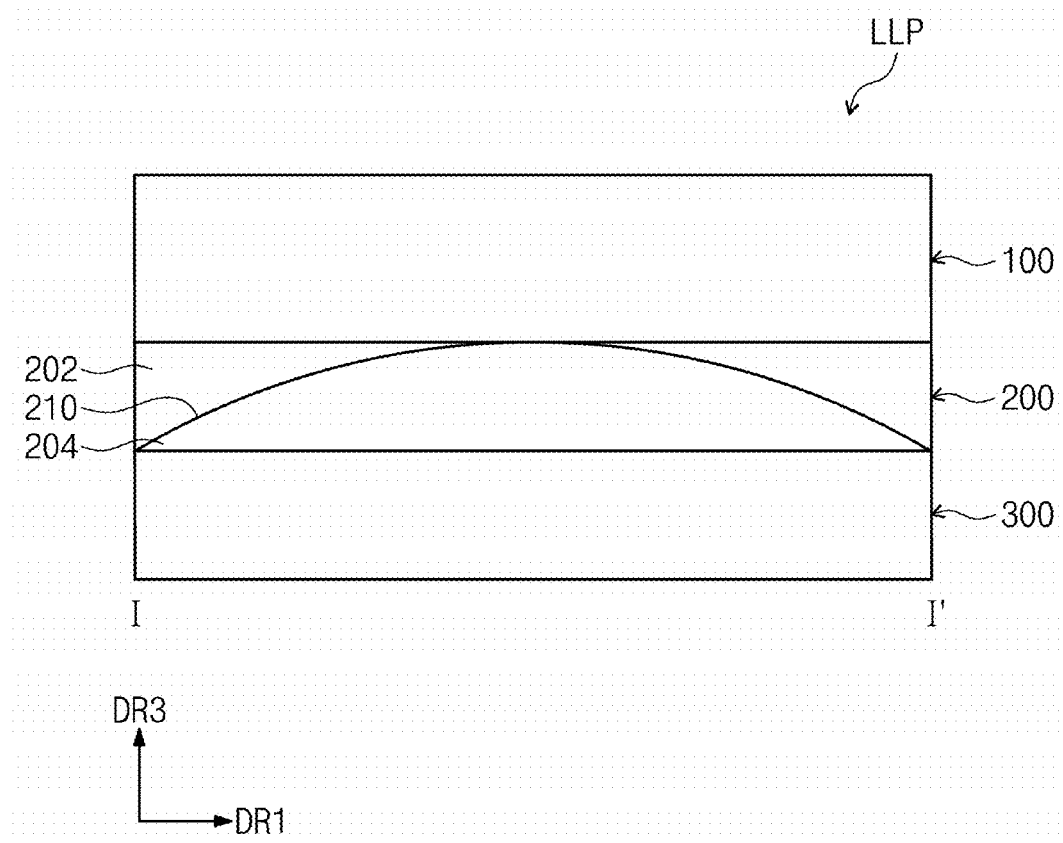
FIG. 4 is a cross-sectional view taken along line I-I' of FIG. 3.

FIG. 3 is a plan view showing a lenticular lens panel according to an embodiment of the disclosure. FIG. 4 is a cross-sectional view taken along line I-I' of FIG. 3. FIG. 4 is a cross-sectional view showing a unit lens of the lenticular lens panel.

Referring to FIGS. 3 and 4, a lens of the lenticular lens panel LLP is disposed inclined at an angle of about 15.95 degrees in the second direction DR2. Here, the second direction DR2 may be a direction parallel to a side of the lenticular lens panel. In one embodiment, for example, where the lenticular lens panel LLP has a rectangular shape when viewed from a front plan view (i.e., a plan view in a thickness direction of the lenticular lens panel LLP), the second direction DR2 may be a short side direction thereof, as shown in FIG. 3. In an embodiment, a width of the unit lens is about 0.12342 mm, and a radius of curvature of the unit lens is about 0.318 mm. In one embodiment, for example, a height (or thickness) of the insulating layer 200 including the unit lens is about 0.00723 mm, and a height (or thickness) of the first and second substrates 300 and 100 respectively disposed under and on the insulating layer 200 is about 0.5 mm. A low-refractive portion 202 of the insulating layer 200 has a refractive index of about 1.5, and a high-refractive portion 204 including the liquid crystal molecules of the insulating layer 200 is about 1.8. The unit lens is a concave lens or a convex lens.

Figure 5A:
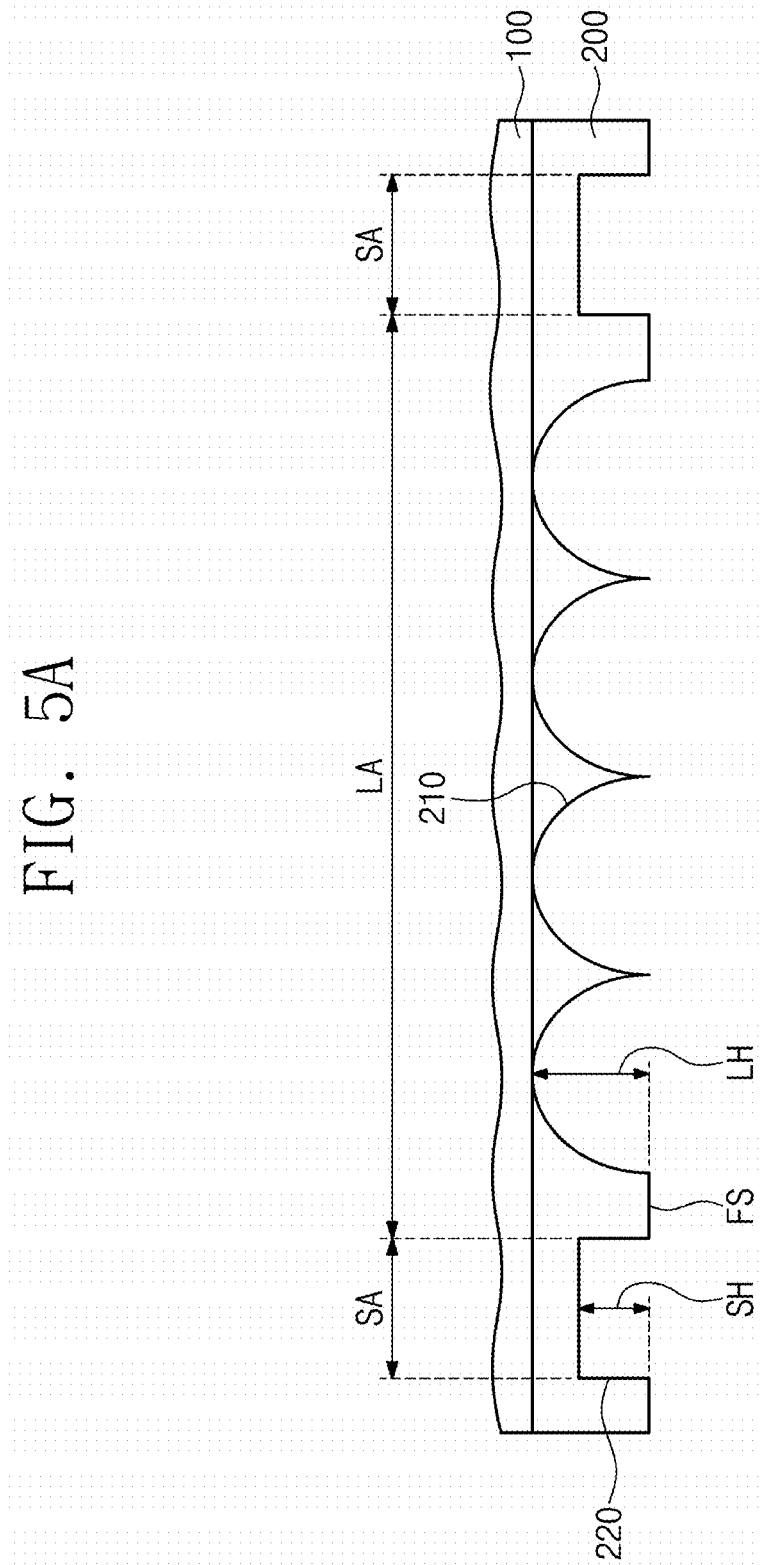
FIGS. 5A and 5B are cross-sectional views showing insulating layers according to an embodiment of the disclosure.
Figure 5B:
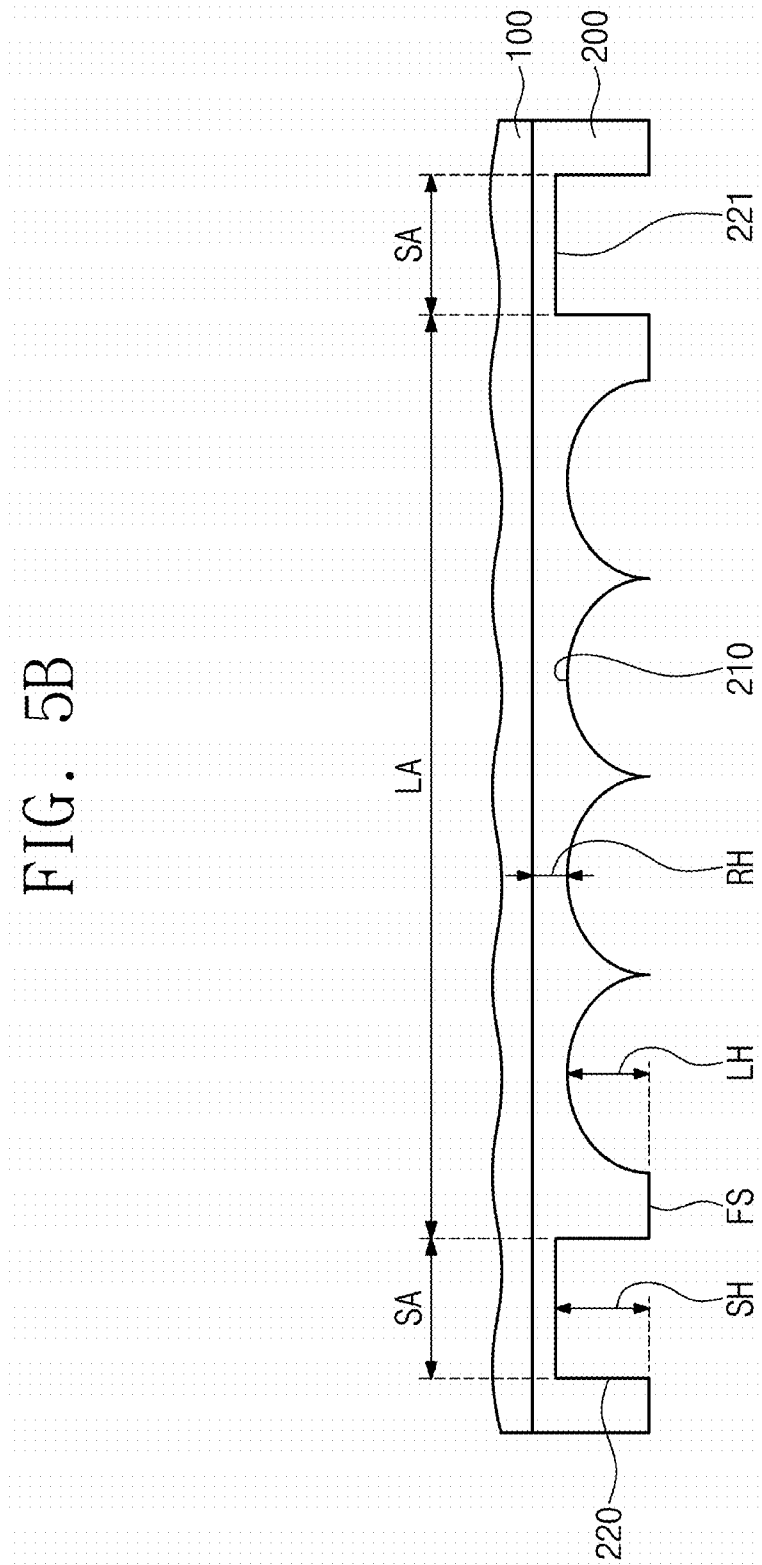

FIGS. 5A and 5B are cross-sectional views showing insulating layers according to an embodiment of the disclosure.

In an embodiment, as shown in FIGS. 5A and 5B, a distance between an upper surface of a groove 220 and a first substrate 300 (refer to FIG. 2) is the same as a height (or depth) of the groove 220. The height or depth of the groove 220 is smaller than a height of an insulating layer 200. An upper end of the groove 220 is spaced apart from a second substrate 100.

Referring to FIG. 5A, in an embodiment, a maximum length LH between a plurality of lenticular lens surfaces 210 and a flat surface FS is greater than a distance SH between the upper surface 221 of the groove 220 and the flat surface FS. In one embodiment, for example, the distance SH between the upper surface 221 of the groove 220 and the flat surface FS corresponds to the height or depth of the groove 220, and the height or depth of the groove 220 is in a range from about 3 micrometers (μm) to about 5 μm. In such an embodiment, where the maximum length from the lenticular lens surfaces 210 to the flat surface FS defined between the end of the lenticular lens surfaces 210 and the end of the groove 220 is equal to or greater than about 5 μm, the maximum length from the lenticular lens surfaces 210 to the flat surface FS is the same as the height of the insulating layer 200.

Referring to FIG. 5B, in an alternative embodiment, a maximum length LH between a plurality of lenticular lens surfaces 210 and a flat surface FS is equal to or smaller than a distance SH between an upper surface of a groove 220 and the flat surface FS. In one embodiment, for example, a height or depth of the groove 220 is in a range from about 3 μm to about 5 μm. In an embodiment, where the maximum length LH from the lenticular lens surfaces 210 to the flat surface FS is equal to or smaller than about 5 μm and the maximum length LH from the lenticular lens surfaces 210 to the flat surface FS is smaller than the height or depth of the groove 220, the lenticular lens surfaces 210 are spaced apart from the second substrate 100 by a predetermined distance RH.

FIGS. 6A to 6D are cross-sectional views showing a lenticular lens panel according to an embodiment of the disclosure.

Figure 6A:
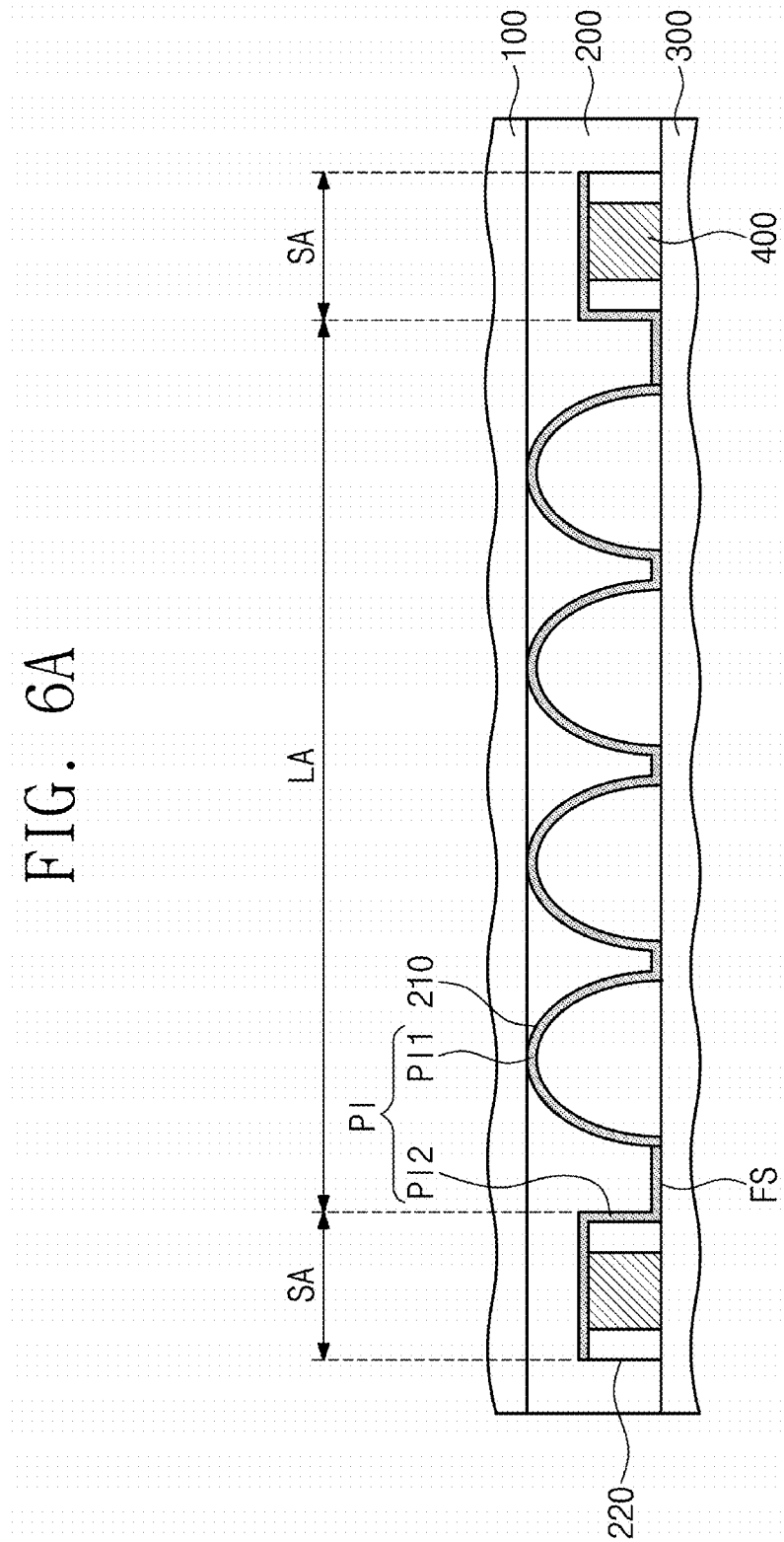

Referring to FIG. 6A, in an embodiment, an alignment layer PI disposed on an insulating layer 200 includes a first alignment layer PI1 disposed on a plurality of lenticular lens surfaces 210 and a second alignment layer PI2 disposed on a flat surface FS. The second alignment layer PI2 extends to a side surface of a groove 220 adjacent thereto and extends to an upper surface 221 of the groove 220. A sealing member 400 is disposed on the second alignment layer PI2 in the groove 220.

Figure 6B:
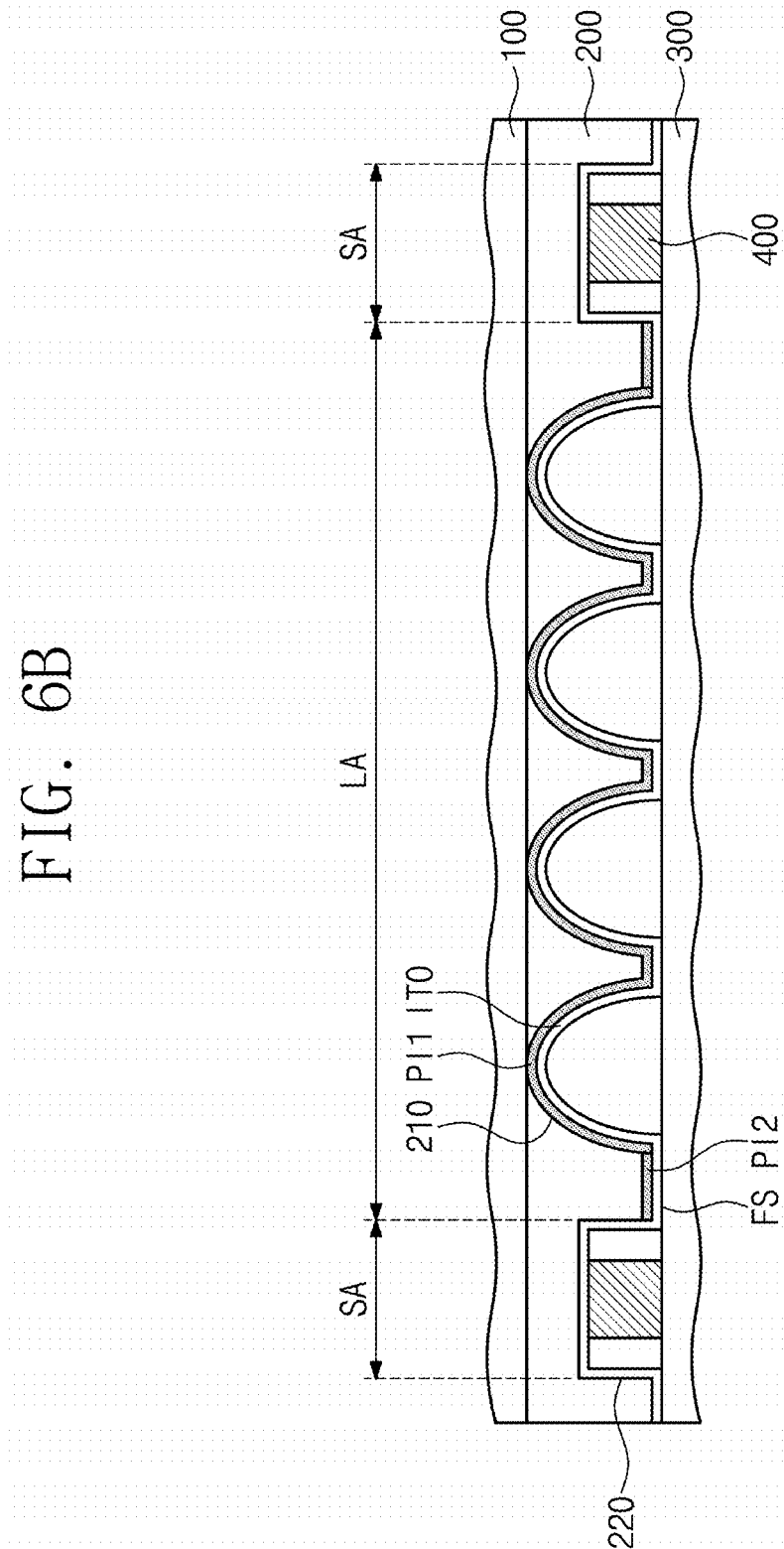

Referring to FIG. 6B, in an alternative embodiment, the lenticular lens panel may further include a first conductive layer ITO disposed on a first alignment layer PI1 and a second alignment layer PI2. The first conductive layer ITO extends to the groove 220.

Referring to FIG. 6C, in another alternative embodiment, the lenticular lens panel may further include a third alignment layer PI3 disposed on its upper surface facing an insulating layer 200. In such an embodiment, a sealing member 400 is disposed between a second alignment layer PI1 disposed on an upper surface of a groove 220 and the third alignment layer PI3.

Figure 6D:
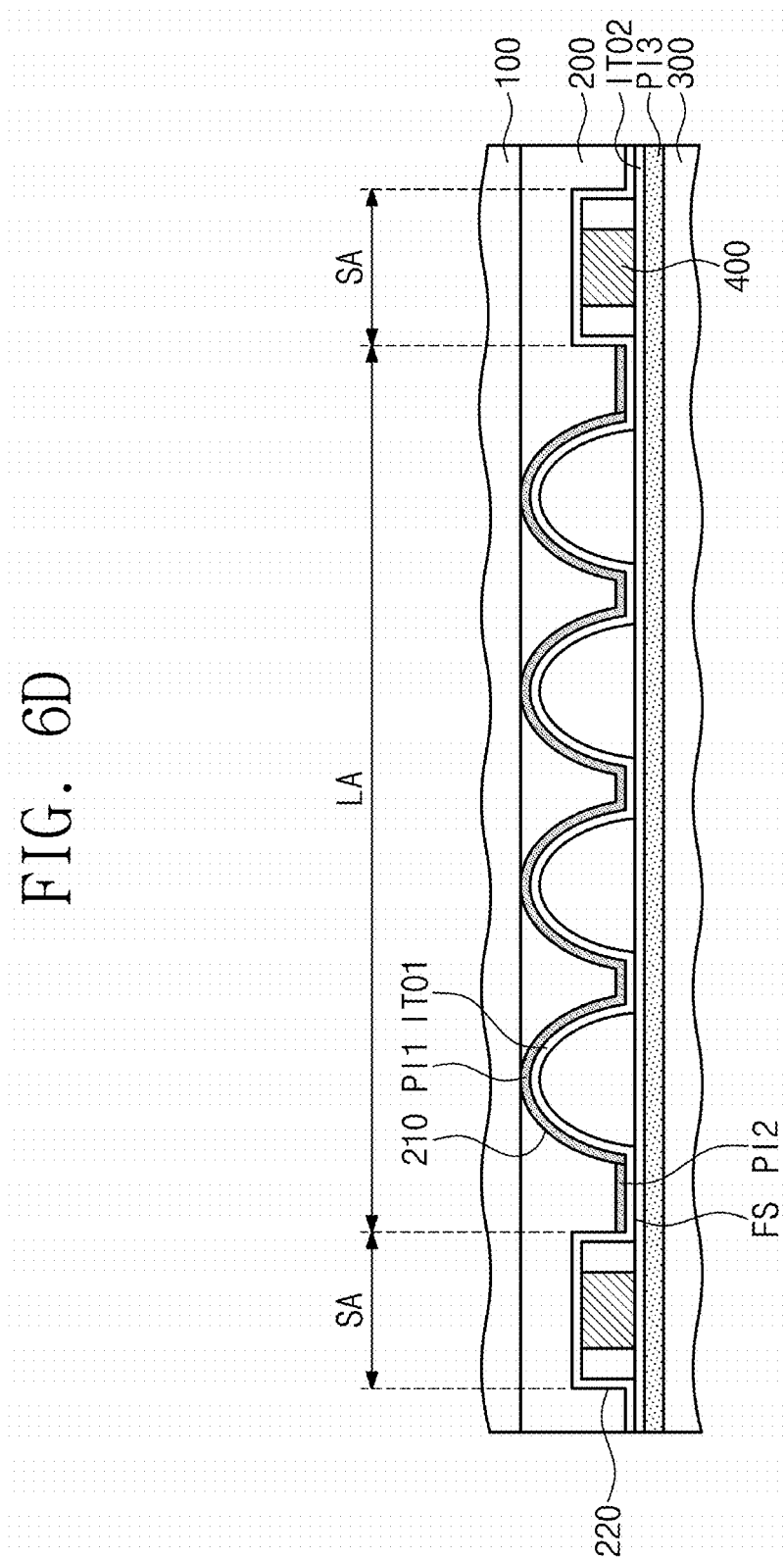

Referring to FIG. 6D, in another alternative embodiment, the lenticular lens panel may further include a second conductive layer ITO2 disposed on a third alignment layer PI3. In such an embodiment, a sealing member 400 is disposed between a first conductive layer ITO1 on an upper surface of a groove 220 and the second conductive layer ITO2.

Figure 7B:
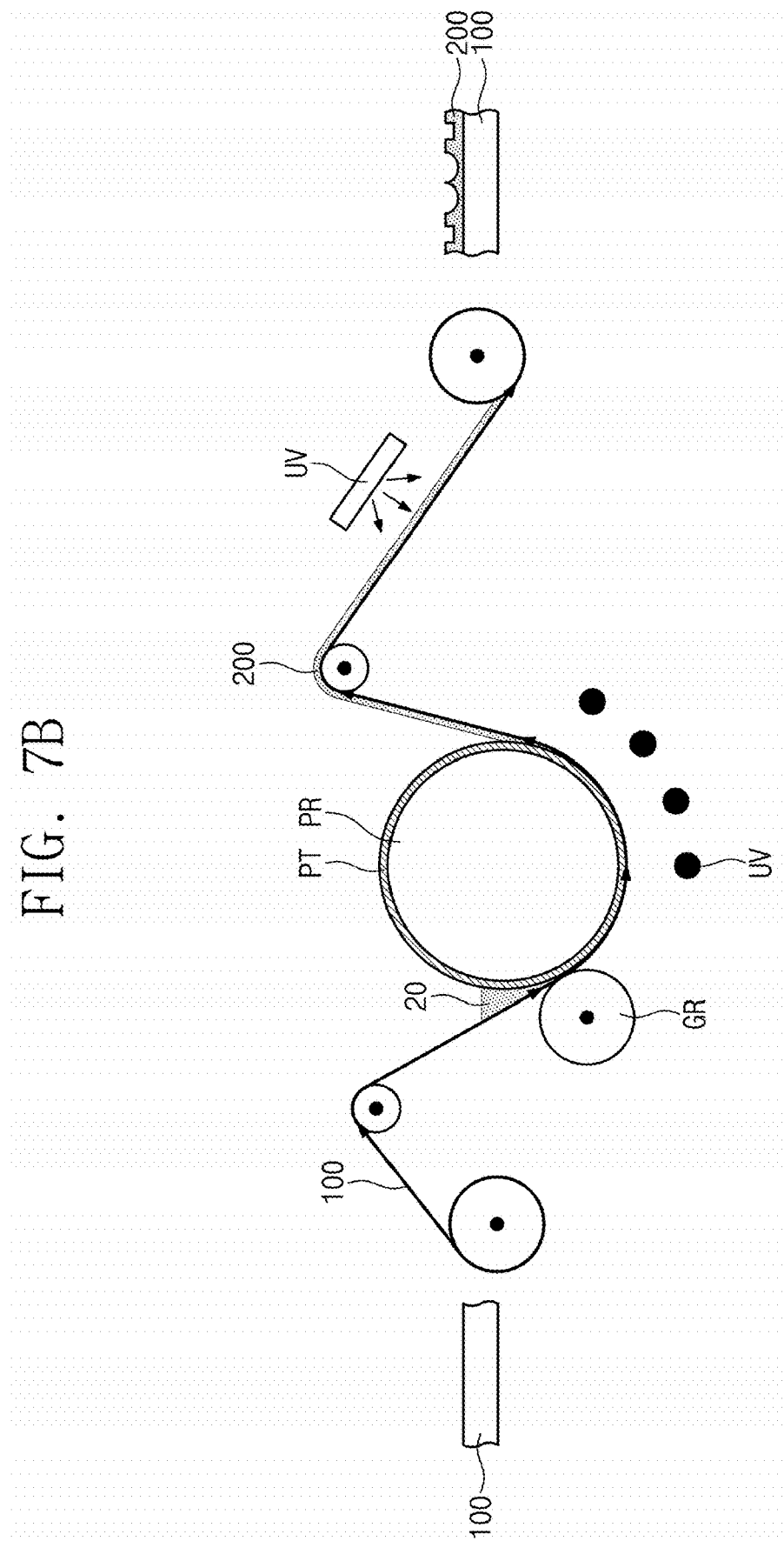

FIGS. 7A and 7B are views showing a method of manufacturing a lenticular lens panel according to an embodiment of the disclosure.

FIG. 7A is a flow chart showing an embodiment of the manufacturing method of the lenticular lens panel, and FIG. 7B is a view showing an operation of forming an insulating layer of FIG. 7A.

Referring to FIG. 7A, an embodiment of the manufacturing method of the lenticular lens panel includes providing (or preparing) the first substrate, forming the insulating layer in which the groove and the lenticular lens surface are defined on a surface of the first substrate, providing the second substrate, providing the sealing member between the insulating layer and the second substrate to correspond to the groove, providing the liquid crystal layer between the lenticular lens surface and the second substrate, and combining the insulating layer with the second substrate.

Referring to FIG. 7B, in an embodiment, the forming the insulating layer includes coating the ultraviolet-curable resin on the first substrate in a film shape, pressing a mold having a shape corresponding to the groove and a shape corresponding to the lenticular lens surface to the ultraviolet-curable resin, and irradiating an ultraviolet ("UV") light to the ultraviolet-curable resin to which the mold is pressed.

In an embodiment, in a process of forming the insulating layer, the second substrate 100 in a film shape is provided, and an ultraviolet-curable resin 20 is coated on an upper surface of the second substrate 100. A pattern roller PR is used in the coating of the ultraviolet-curable resin 20. The pattern roller PR includes patterns PT corresponding to the shapes of the lenticular lens surface and the groove. The patterns PT of the lenticular lens surfaces and the groove are formed in the ultraviolet-curable resin 20 by the pattern roller PR, and the insulating layer 200, in which the lenticular lens surfaces and the groove are defined, is formed through the irradiation of the UV light.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel which displays an image; and
a lenticular lens panel disposed above the display panel, wherein a lenticular lens area and a sealing area adjacent to the lenticular lens area are defined in the lenticular lens,
wherein the lenticular lens panel comprises:
a first substrate disposed on the display panel;
a second substrate disposed opposite to the first substrate;
an insulating layer disposed between the first substrate and the second substrate, wherein a plurality of lenticular lens surfaces overlapping the lenticular lens area and a groove overlapping the sealing area are defined on the insulating layer;
a sealing member disposed in the groove, wherein the sealing member combines the first substrate with the insulating layer; and
a plurality of liquid crystal molecules disposed between the lenticular lens surfaces and the first substrate,
wherein the groove extends a first length in a thickness direction of the insulating layer less than a second length defining an entire thickness of the insulating layer in the thickness direction.

2. The display device of claim 1, further comprising:
a switching panel disposed between the display panel and the lenticular lens panel,
wherein the switching panel controls the image to be selectively displayed as a two-dimensional image or a three-dimensional image.

3. The display device of claim 1, wherein
the insulating layer includes a flat surface defined between an end of the groove and an end of a lenticular lens surface closest to the groove among the lenticular lens surfaces, and
the flat surface is in contact with the first substrate.

4. The display device of claim 1, wherein
the groove is defined by an upper surface in contact with the sealing member and a side surface perpendicular to the upper surface, and
a length of the side surface is equal to a vertical length of the sealing member.

5. The display device of claim 1, wherein the sealing member has a vertical length greater than a depth of the groove.

6. The display device of claim 1, wherein each of the lenticular lens surfaces is a concave lens surface.

7. The display device of claim 1, wherein the lenticular lens panel further comprises a first alignment layer disposed on the lenticular lens surfaces and a second alignment layer disposed on a flat surface defined between the groove and an end of a lenticular lens surface closest to the groove among the lenticular lens surfaces.

8. The display device of claim 7, wherein a distance between the groove and the end of the lenticular lens surface closest to the groove is in a range from about 2 millimeters to about 5 millimeters.

9. The display device of claim 7, wherein the second alignment layer extends to a side surface and an upper surface of the groove adjacent to the flat surface.

10. The display device of claim 7, wherein the lenticular lens panel further comprises a first conductive layer disposed on the first alignment layer and the second alignment layer, and the first conductive layer extends to the groove.

11. The display device of claim 10, wherein the lenticular lens panel further comprises a third alignment layer disposed on an upper surface of the first substrate facing the insulating layer.

12. The display device of claim 11, wherein the lenticular lens panel further comprises a second conductive layer disposed above the third alignment layer.

13. The display device of claim 1, wherein a maximum distance from the lenticular lens surfaces to the first substrate is equal to a maximum distance from the lenticular lens surfaces to a flat surface defined between an end of the lenticular lens surfaces and an end of the groove.

14. The display device of claim 13, wherein the maximum distance between the lenticular lens surfaces and the flat surface is equal to or smaller than a distance between an upper surface of the groove and the flat surface.

15. The display device of claim 1, wherein a distance between an upper surface of the groove and the first substrate is smaller than a height of the insulating layer.

16. The display device of claim 1, wherein the groove has a depth in a range about 3 micrometers to about 5 micrometers.

17. The display device of claim 16, wherein
a maximum distance from the lenticular lens surfaces to a flat surface defined between an end of the lenticular lens surfaces and an end of the groove is equal to or smaller than about 5 micrometers,
the maximum distance from the lenticular lens surfaces to the flat surface is smaller than the depth of the groove, and
the lenticular lens surfaces are spaced apart from the second substrate.

18. The display device of claim 16, wherein
a maximum distance from the lenticular lens surfaces to the flat surface defined between an end of the lenticular lens surfaces and an end of the groove is equal to or greater than about 5 micrometers, and
the maximum distance between the lenticular lens surfaces and the flat surface is equal to a height of the insulating layer.

* * * * *